United States Patent [19]

Piguet et al.

[11] Patent Number: 5,748,522
[45] Date of Patent: May 5, 1998

[54] MEMORY ELEMENT OF THE MASTER-SLAVE FLIP-FLOP TYPE, CONSTRUCTED BY CMOS TECHNOLOGY

[75] Inventors: Christian Piguet, Neuchatel; Jean-Marc Masgonty, Corcelles, both of Switzerland

[73] Assignee: Centre Suisse D'Electronique et de Microtechnique SA, Neuchatel, Switzerland

[21] Appl. No.: 618,970

[22] Filed: Mar. 20, 1996

[30] Foreign Application Priority Data

Mar. 21, 1995 [FR] France ................... 95 03280

[51] Int. Cl.$^6$ ................................. G11C 111/00
[52] U.S. Cl. .............................. 365/154; 365/156
[58] Field of Search ........................ 365/154, 156; 327/202, 210

[56] References Cited

U.S. PATENT DOCUMENTS

| | | | |
|---|---|---|---|
| 3,976,949 | 8/1976 | Hepworth et al. | 365/154 |
| 4,057,741 | 11/1977 | Piguet | 327/211 |
| 4,227,097 | 10/1980 | Piguet | 327/210 |
| 4,230,957 | 10/1980 | Piguet | 327/210 |
| 4,879,680 | 11/1989 | Luckett et al. | 365/154 |
| 5,257,223 | 10/1993 | Dervisoglu | 365/154 |

FOREIGN PATENT DOCUMENTS

| | | |
|---|---|---|
| 0225075 | 11/1986 | European Pat. Off. |
| 0219907 | 4/1987 | European Pat. Off. |
| 2829968 | 1/1979 | Germany |
| 2830045 | 1/1979 | Germany |

OTHER PUBLICATIONS

"Circuits C-MOS Pseudo-Statiques", Bulletin Annuel de la Societe Suisse de Chronometrie et du Laboratoire Suisse de Recherches Horlogeres, vol. 7, No. 2, 1976, Neuchatel.

"Logic Synthesis of Race-Free Asynchronous CMOS Circuits", IEEE Journal of Solid-State Circuits, vol. 26, No. 3, Mar. 1991, pp. 371–380.

*Primary Examiner*—David C. Nelms
*Assistant Examiner*—Trong Phan

[57] ABSTRACT

A memory element includes a master flip-flop (1) intended to control a slave flip-flop (2) via a transfer variable (A). The slave flip-flop (2) consists of a first gate (2a) controlled by the transfer variable (A), a clock signal (CK) and a true output variable (Q), so as to deliver a complementary output variable (NQ), and a second gate (2b) controlled by the complementary output variable (NQ) and delivering the true output variable (Q). The master flip-flop (1) includes a first gate (1a) controlled by an input variable (D), the clock signal (CK) and a third variable which is formed by the transfer variable (A). The master flip-flop (1) also includes a second gate (1b) controlled by the output (B) from the first gate (1a) of the master flip-flop (1) and delivering the transfer variable (A). The first gate (2a) of slave flip-flop (2) includes, in order to accomplish the transfer of the input signal, only seven transistors at most.

25 Claims, 6 Drawing Sheets

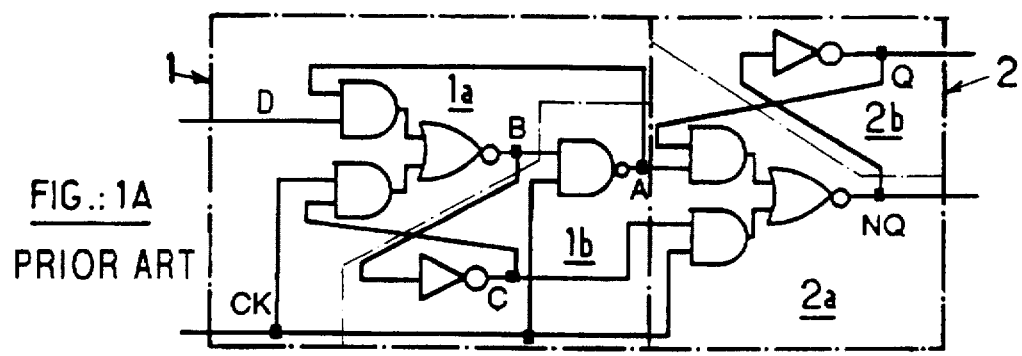
FIG.:1A
PRIOR ART
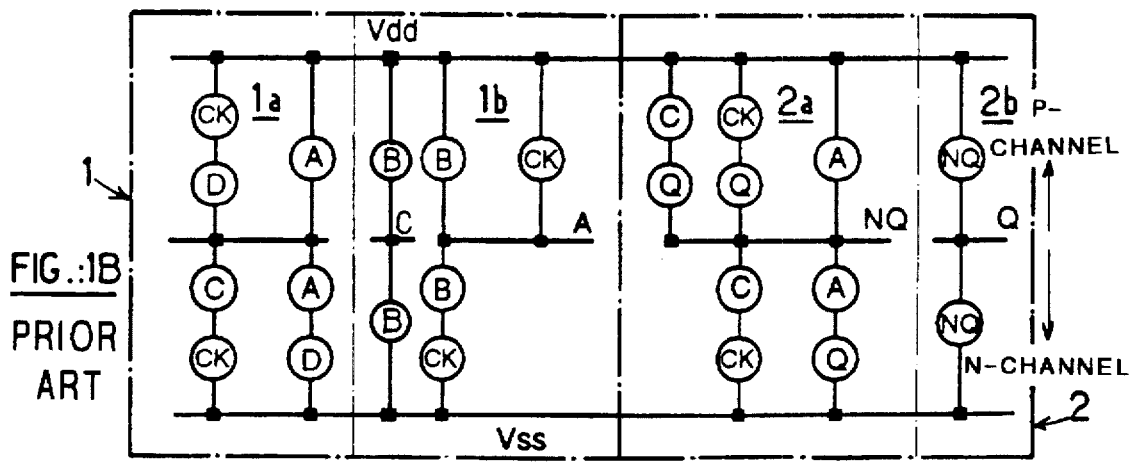
FIG.:1B
PRIOR ART
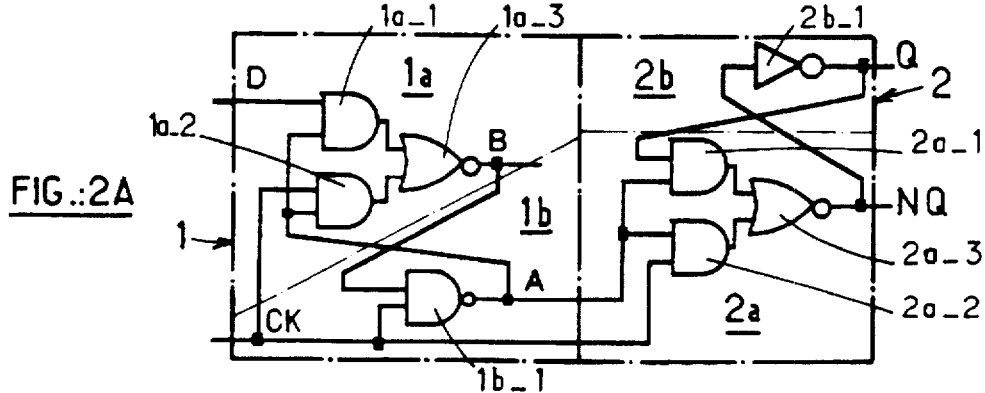
FIG.:2A
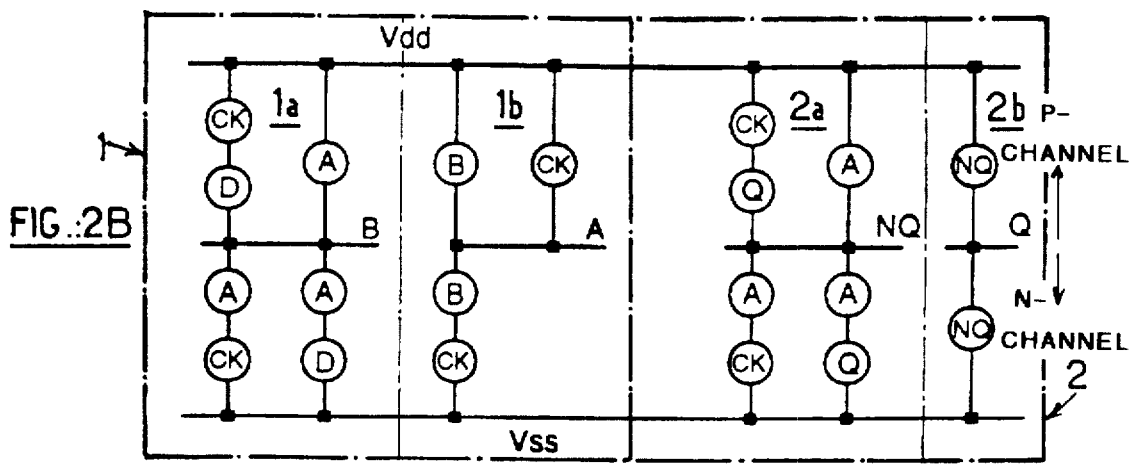
FIG.:2B

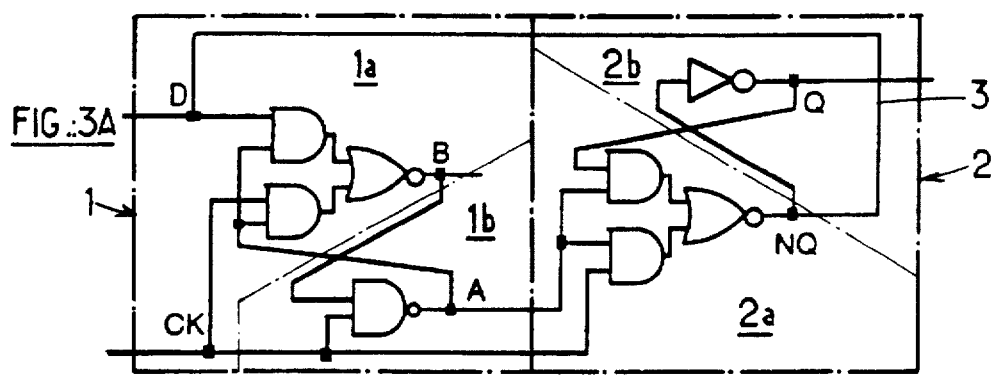
FIG.:3A
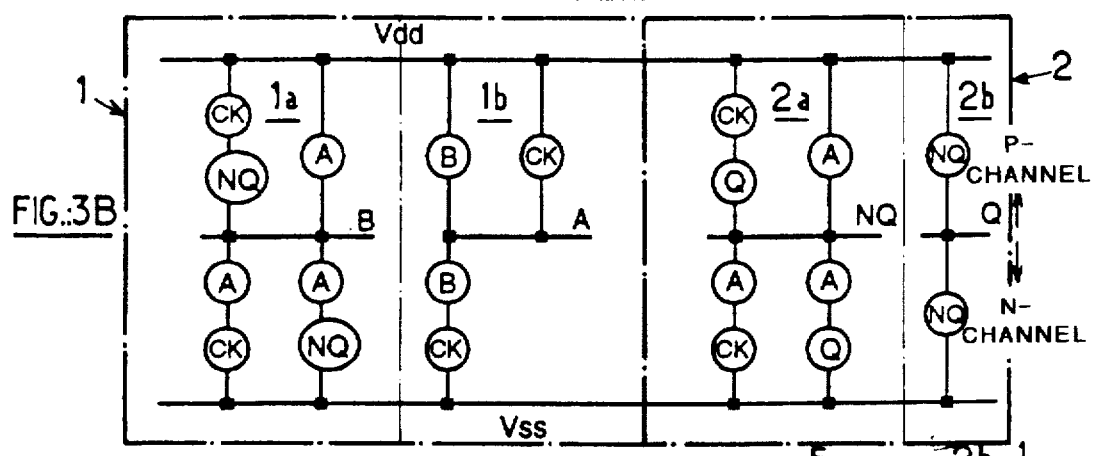
FIG.:3B
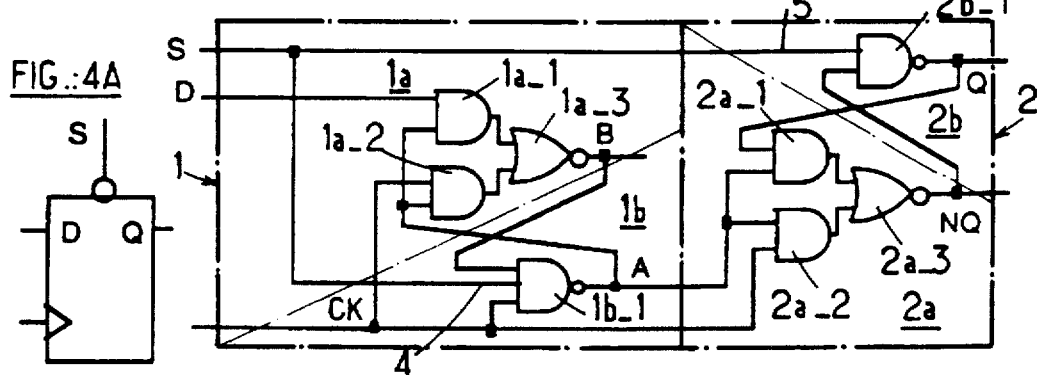
FIG.:4A
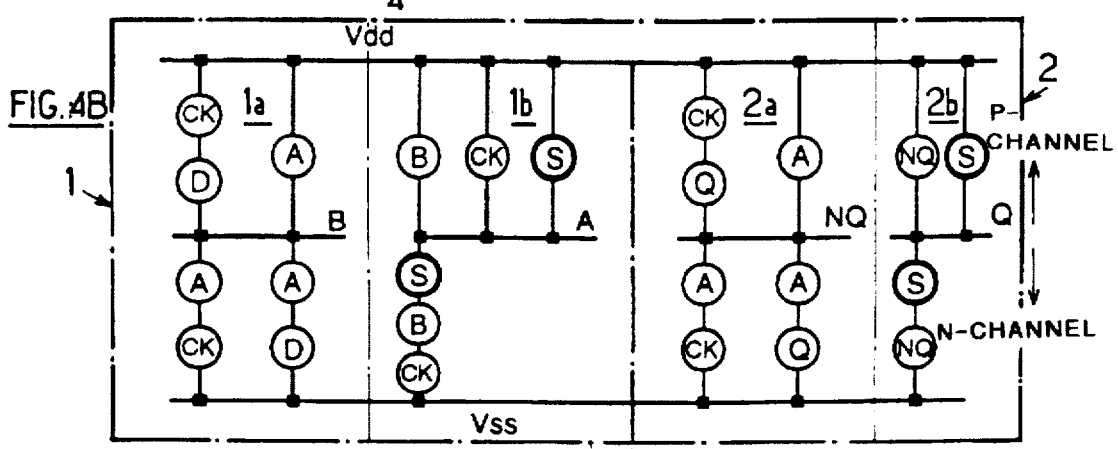
FIG.:4B

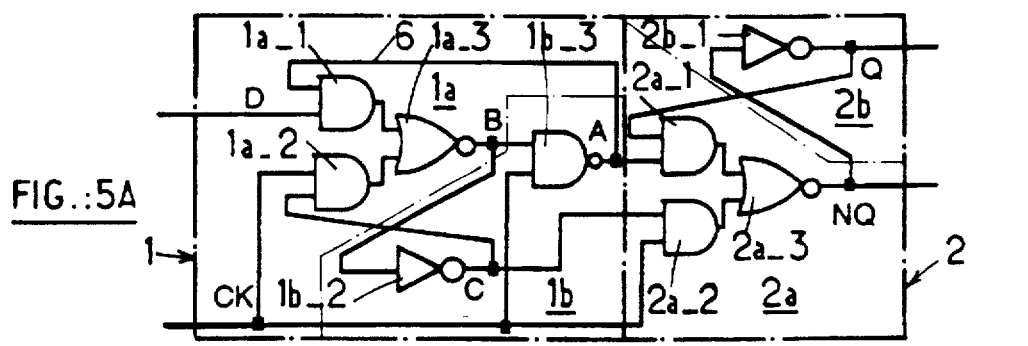
FIG.:5A
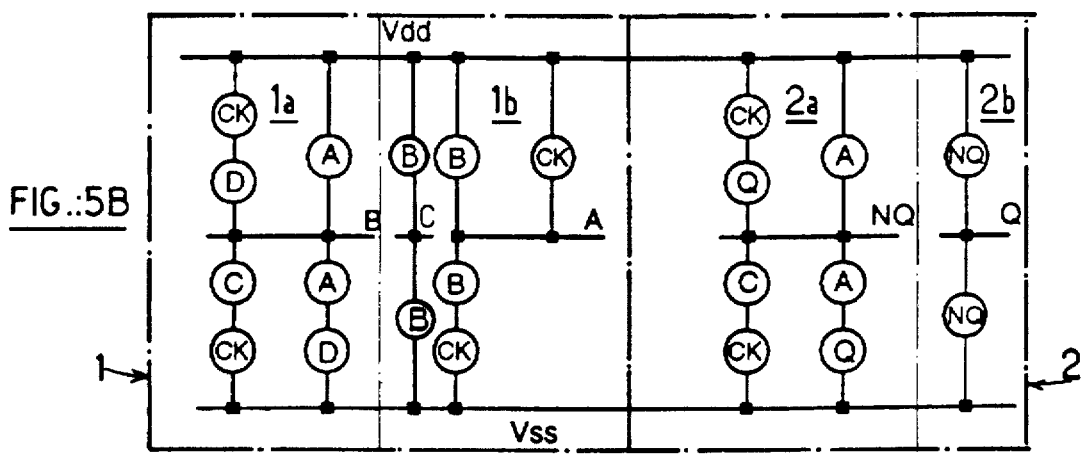
FIG.:5B
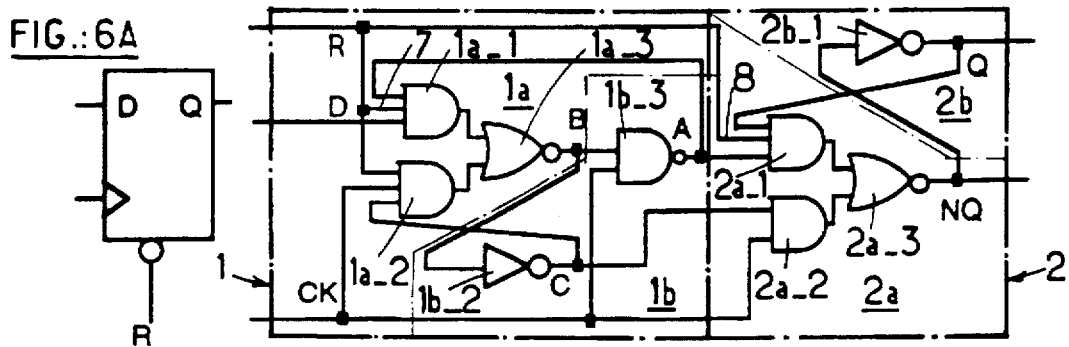
FIG.:6A
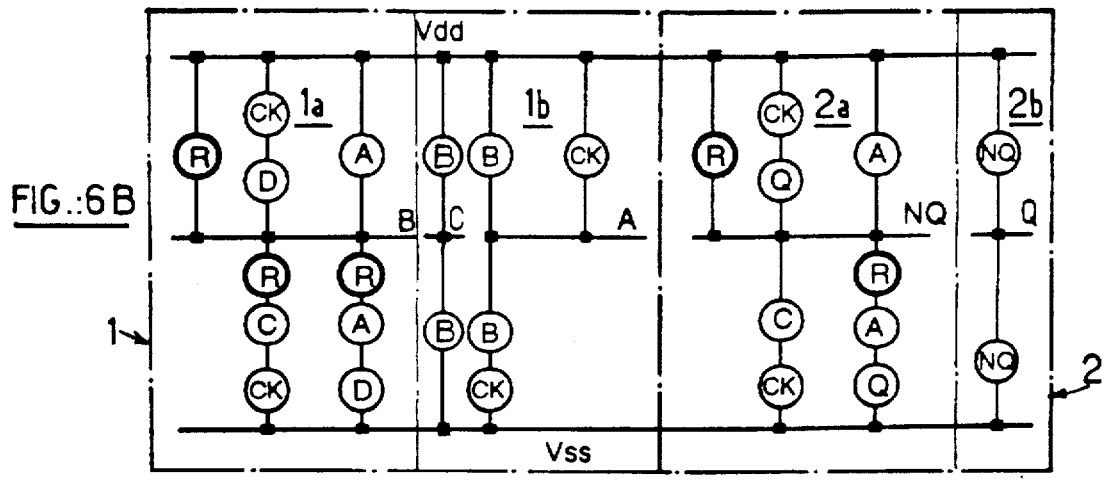
FIG.:6B

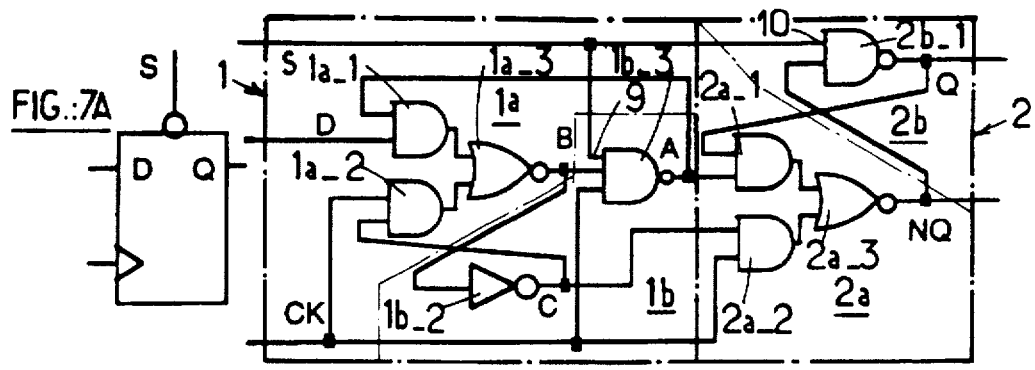
FIG.:7A
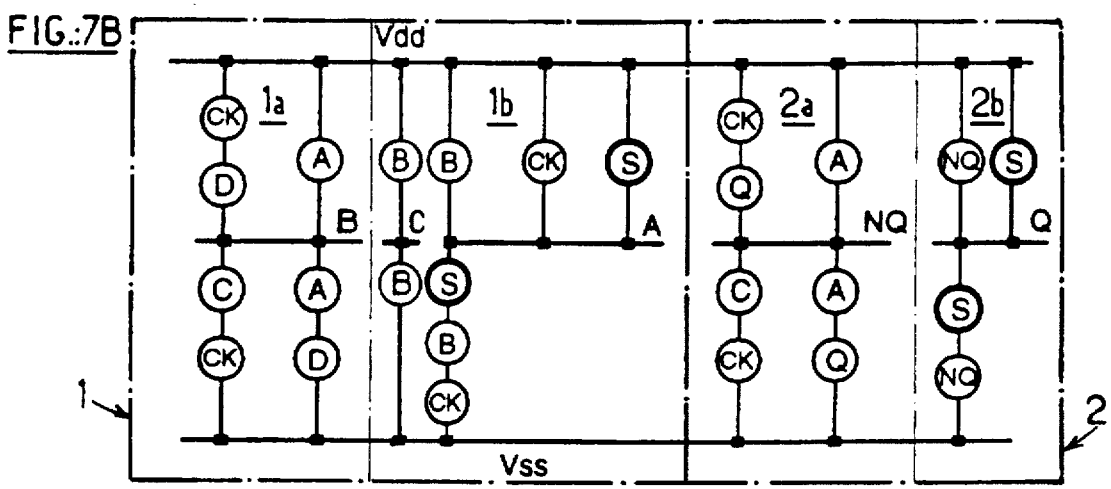
FIG.:7B
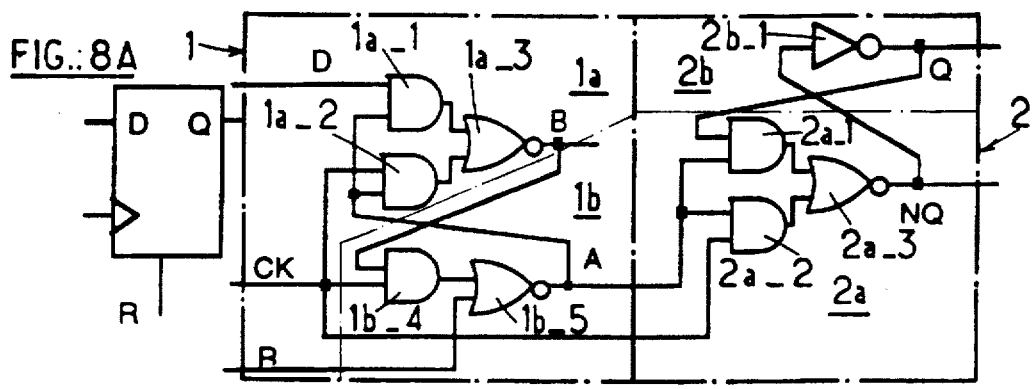
FIG.:8A
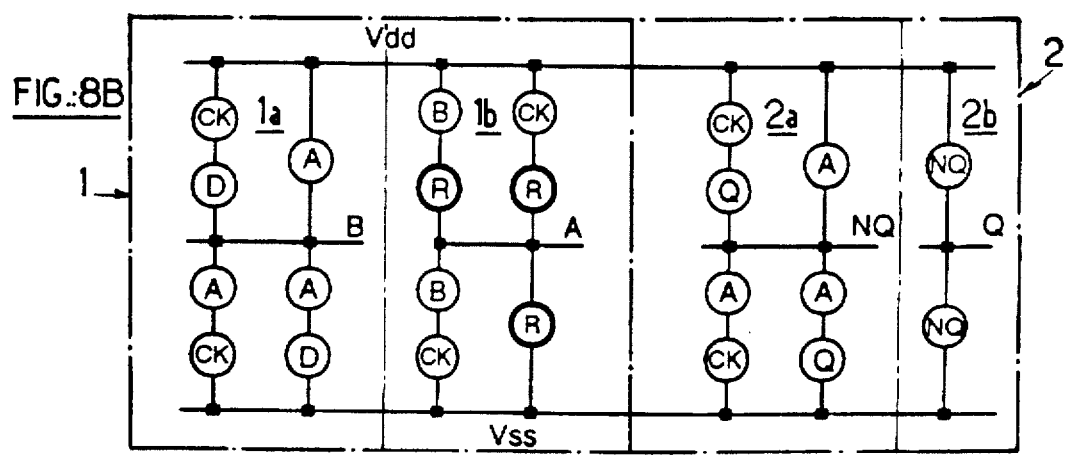
FIG.:8B

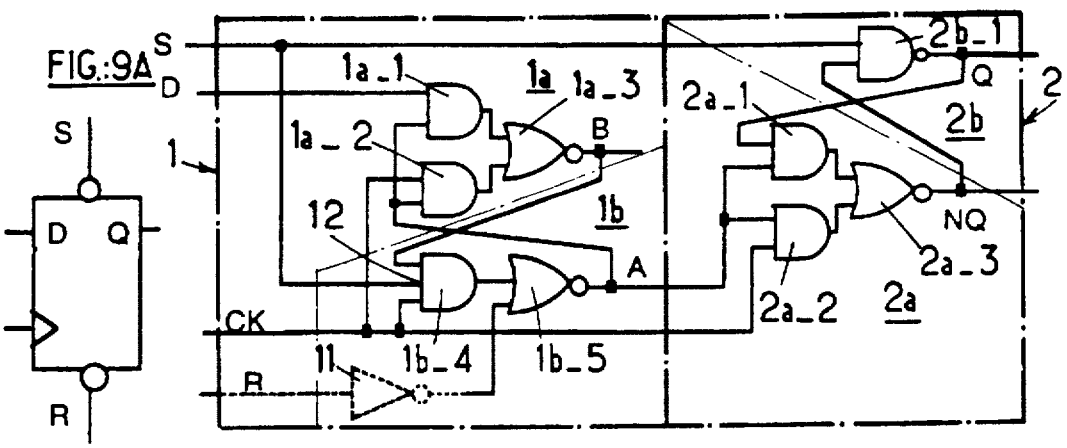
FIG. 9A
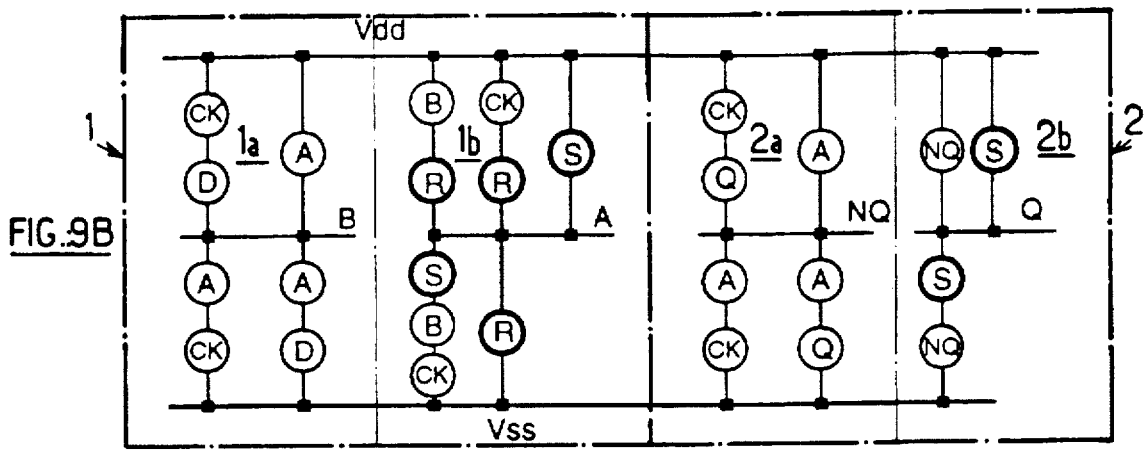
FIG. 9B
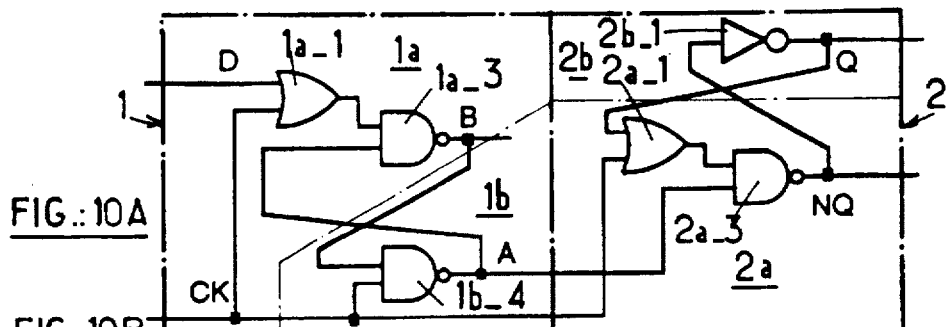
FIG.: 10A
FIG.: 10B
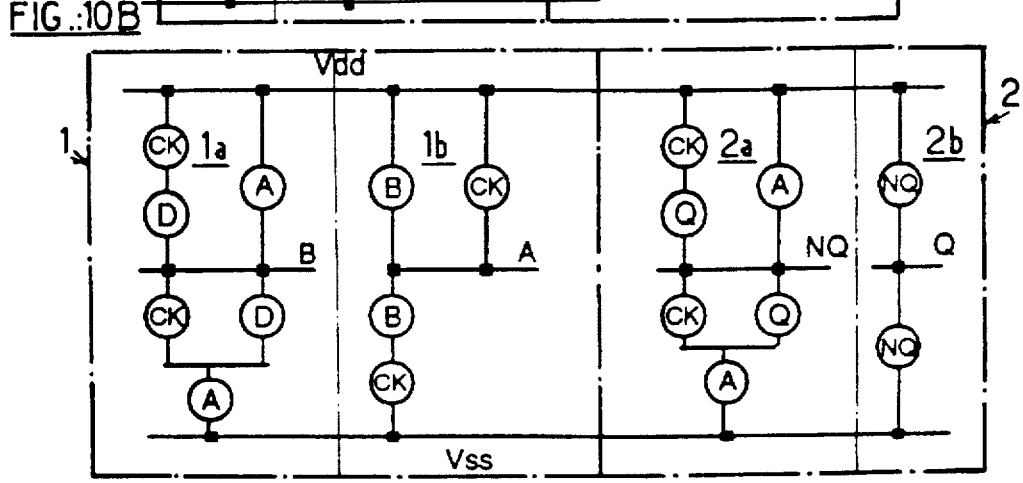

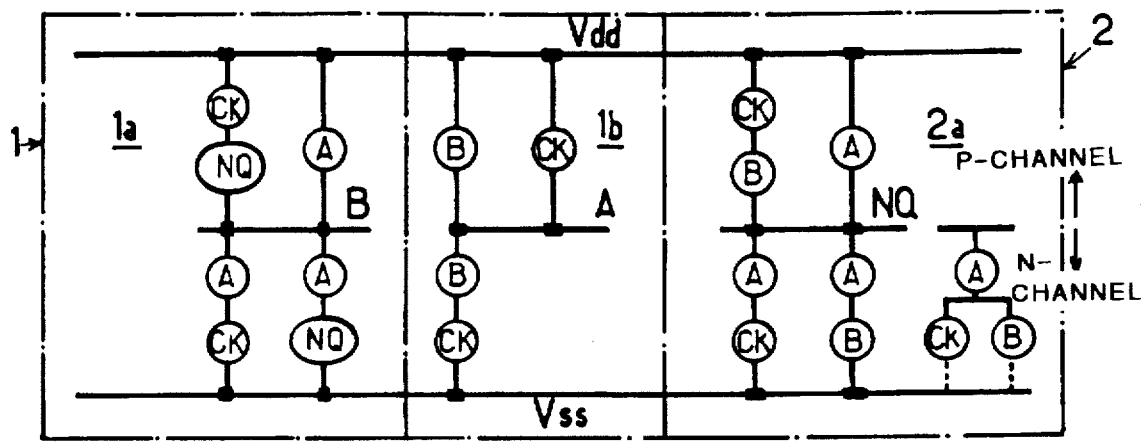
FIG.: 11B
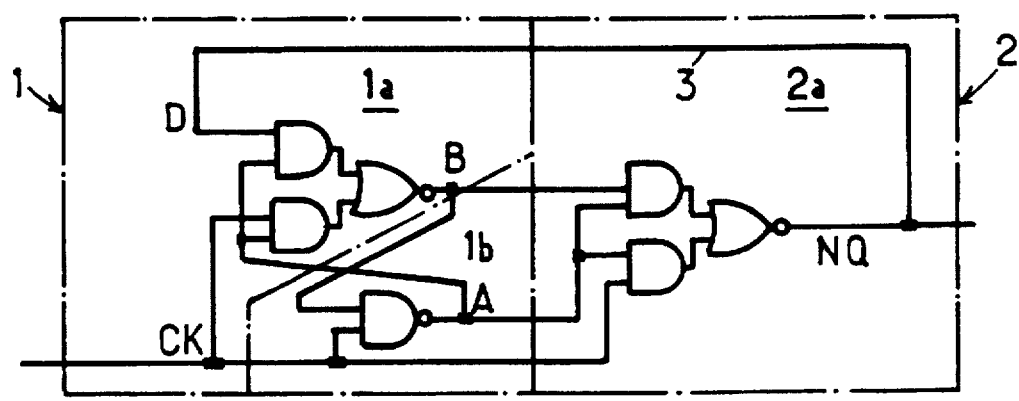
FIG.: 11A

MEMORY ELEMENT OF THE MASTER-SLAVE FLIP-FLOP TYPE, CONSTRUCTED BY CMOS TECHNOLOGY

The present invention relates to a memory element and, more particularly, to D-type flip-flops commonly termed master-slave flip-flops.

It is known that D-type flip-flops are intended for transfering an input logic variable to their output under the control of a clock signal. These flip-flops may have simple circuitry and constitute what is regularly termed a "latch" or else be more complex and form a so-called "master-slave" flip-flop in which, in principle, the slave copies the state of the master (determined as a function of the input variable) under the control of one of the logic states of the clock signal. The present invention is more particularly aimed at this latter form of flip-flop.

Experts in CMOS technology are also aware of a topography which is particularly efficient both from the standpoint of energy consumption, speed and uniformity of layout, as well as that of the size of the integrated circuit (i.e. roughly speaking the required number of transistors and their interconnections). This is the so-called "branched" topography of which U.S. Pat. No. 4,227,097 gives one of the first descriptions. In such a topography, the CMOS transistors of each gate forming a D-type flip-flop are constituted by a first set of P-channel transistors and a second set of N-channel transistors, these two sets of transistors being connected in series across the terminals of a voltage supply source $V_{dd}$ and $V_{ss}$ with the common connection point of the two sets forming the output node of the gate. The conduction paths of the transistors are connected in series and/or in parallel within each set so that the conduction state of these transistors determines the potential at the output node of the gate, which potential represents the inner variable provided by this gate and may take values substantially equal to those at the two terminals of the supply voltage source.

This technology has already been used for master-slave D-type flip-flops to which the invention is more particularly addressed.

One of the preoccupations of designers of logic circuits of this kind stems from a property of the logic circuits of tending sometimes to provide an indeterminate state at their output, depending on the input variables. This property is termed "racing" by experts and naturally it should, as far as possible, be avoided so that the circuit should always yield the same preferential state at its output, depending on a specified set of its input variables. Although configuration of the circuit does not enable racing to be avoided completely, it is at least possible to direct it, especially by dimensioning the transistors of the circuit appropriately. In this case, experts speak of "critical racing".

The ideal solution would obviously be to design a circuit which is completely devoid of "racing" and which at the same time exhibits the other favorable properties which it would be desirable to confer on it, such as for example very low consumption, high operating speed and small size. However, these favorable qualities turn out to be essentially contradictory and it turns out that a compromise must in fact be sought between, on the one hand, "racing" and, on the other hand, the other qualities just mentioned.

The object of the invention is to provide a memory element of the general type stated above and which enables the best possible compromise to be obtained between all the determining properties which such an element should possess.

The subject of the invention is therefore a memory element of the master-slave flip-flop type constructed by CMOS art and able to transfer an input logic variable to a true output and a complementary output of the element under the control of a clock signal, said element including a master flip-flop intended to control a slave flip-flop via at least one transfer variable, said slave flip-flop consisting of a first gate controled by said at least one transfer variable, said clock signal and said true output variable, so as to deliver said complementary output variable, and a second gate controled by said complementary output variable and delivering said true output variable, said master flip-flop including a first gate controled by said input variable, said clock signal and at least one third variable which is formed by said at least one transfer variable, said master flip-flop also including a second gate of inverting type controled by the output from said first gate of the master flip-flop and delivering at least one of said transfer variables, said memory element being one in which said first gate of said slave flip-flop includes, in order to accomplish the transfer of said input signal, only seven transistors at most.

According to a first embodiment of the invention, said second gate of inverting type of the master flip-flop includes a NAND type gate, a first input of which is controled by the output from said first gate of the master flip-flop, a second input of which is controled by said clock signal and the output of which is fed back to said first gate of the master flip-flop, while forming the single output delivering a transfer variable.

In accordance with a second embodiment of the invention, said second gate of the inverting type of said master flip-flop includes an elementary inverter, the input of which is connected to the output of said first gate of this flip-flop and the output of which is fed back in order to control said first gate of the master flip-flop while yielding one of said transfer variables, said second gate of the inverting type also comprising a NAND type elementary gate, a first input of which is connected to the output of said first gate of the master flip-flop, a second input of which is controled by said clock signal and the output from which constitutes the other transfer variable for said slave flip-flop, while also being fed back in order to control said first gate of said master flip-flop.

Other characteristics and advantages of the invention will emerge in the course of the following description, given merely by way of example and undertaken while refering to the appended drawings in which:

FIGS. 1A and 1B show an example of a master-slave flip-flop of the D type of the prior art;

FIGS. 2A and 2B show a first example embodiment of a master-slave flip-flop of the D type according to the invention, this version enabling the compromise stated above to be biased towards a small number of transistors;

FIGS. 3A and 3B show a variant embodiment of the flip-flop of FIGS. 2A and 2B, in a version which may serve more particularly to build a divider by 2;

FIGS. 4A and 4B show another variant embodiment of the D flip-flop according to the invention, this flip-flop including an additional command S;

FIGS. 5A and 5B show another embodiment of the invention in which the compromise stated above is biased in favor of complete elimination of racing;

FIGS. 6A and 6B show a variant of the flip-flop of FIGS. 5A and 5B, additionally including a command R;

FIGS. 7A and 7B show another variant of the flip-flop of FIGS. 5A and 5B additionally provided with a command S;

FIGS. 8A–8B, 9A–9B and to 10A–10B show several more other variants of the flip-flop according to the invention;

FIGS. 11A and 11B show a variant of the divider by 2 represented in FIGS. 3A and 3B.

In the following description, each embodiment of the flip-flop of the invention and each of their variants will be examined with the help of a first so-called functional diagram which includes the usual symbols for logic gates, and of a second so-called "branch" diagram which more particularly shows its topography. It should be noted that the characteristics which illustrate the invention are especially reflected in the second diagrams of the flip-flops, the functional diagrams possibly being, in certain cases, identical despite an essential difference in the topography of the flip-flops concerned.

This so, it is conventionally accepted that the logic gates employed are designated through their output variable on both types of diagrams. Moreover, in the second diagrams, the various MOS transistors have been symbolized by circles containing the control variable applied to their gate, the connections depicted being those of their conduction path.

Furthermore, the transistors connected between the output nodes and the positive terminal ($V_{DD}$) of the power supply are P-channel transistors, whereas those connected between the output nodes and the negative terminal ($V_{SS}$) of this supply are N-channel transistors. By convention, the potentials of the terminals $V_{DD}$ and $V_{SS}$ are respectively denoted 1 and 0, which also represents the possible logic levels of the control variables of the flip-flop.

It is also to be noted that all the master-slave D-type flip-flops described herein are of the static type rather than of the dynamic type.

Flip-flops of the dynamic type generally operate with high clock frequencies and their operation is based on the presence of the parasitic capacitances of the transistors they are composed of.

Static type flip-flops to which the present invention pertains, are used generally in very low power consumption conditions so that clock frequencies must be relatively low. Therefore, the inputs and the outputs in both the master part and the slave part of a static type flip-flop must be connected together by means of cross-retroconnections as may be seen on each of the transistor diagrams among the accompanying drawings. Thus, a flip-flop of the type described herein basically remains in its current state until the clock signal triggers the opposite state of the flip-flop.

Refering now to FIG. 1A, this represents a master-slave D-type flip-flop according to the prior art, notably disclosed during the "PATMOS '94" conference in Barcelona by C. Piguet et al. under the title "Low Power, Low-Voltage Digital CMOS Cell Design". This flip-flop includes a master 1 and a slave 2, both surrounded by thick chain-dotted lines, each of these parts of the flip-flop itself including a first gate (1a and 2a resp.) and a second gate which are separated by a thin chain-dotted line (1b and 2b resp.). This notation will be adhered to in all the drawings for all the embodiments of the invention, as well as for all their variants. No further detailed examination of the diagram of the flip-flop will be made at this stage of the description. For the moment, refering to FIG. 1B, it will be noted that the gate 2a of the slave 2 (which can also be termed the NQ gate, i.e. the one delivering the complement output variable) includes nine transistors, this being the price to be paid for this flip-flop to be devoid of racing.

FIGS. 2A and 2B will now be examined in order to describe a first embodiment of the invention.

Appearing again are the master 1 and the slave 2 as well as the four gates 1a, 1b, 2a and 2b of which they consist.

According to the functional diagram of FIG. 2A, the gate 1a includes various elementary gates, namely an AND gate 1a-1 controled by the variable D and the internal variable A, an AND gate 1a-2 controled by the variable CK (i.e. the clock) and the internal variable A. The outputs of these two gates are applied as inputs to a NOR gate 1a-3 which delivers the internal variable B.

The gate 1b of the master 1 here includes only a single elementary gate 1b-1 formed by a NAN D gate which receives the variable CK and the internal variable B on its inputs while delivering the internal variable A on its output. In the present embodiment, this variable A is the only transfer variable involved in passing the input variable D to the slave 2.

The first gate 2a of the slave 2 includes the following elementary gates: an AND gate 2a-1, one of the inputs of which is controled by the internal variable A and the second input of which is linked to the true output Q of the slave, an AND gate 2a-2, one of the inputs of which also receives the internal variable A and the other input of which is controled by the variable CK, and a NOR gate 2a-3 which receives the outputs from the AND gates 2a-1 and 2a-2 and which delivers the complementary output variable NQ.

The second gate 2b of the slave 2 includes only a single elementary circuit, namely an inverter 2b-1 which receives the variable NQ on its input and delivers the variable Q at its output.

It will be noted that in all the embodiments and variants of the invention, the functional diagrams of the first gate 1a of the master 1 and the slave 2 are as a whole identical, at the very least as regards their basic functions. The elements of which they consist are therefore, in all instances, indicated by the same references as described above.

Examining now FIG. 2B, it is seen that the topography of this flip-flop is designed as follows in which the first column indicates the gates and the designation of the signal produced at their output, the second column indicates the number of groups of transistors in each gate and the third and fourth columns list the number of P and N channel transistors in each group, designating each transistor by the control signal applied to its gate, and when there is more than one transistors of a given conductivity type in a group, the fact that they are connected serially. The groups of transistors are connected in parallel between the power supply terminals $V_{dd}$ and $V_{ss}$ with the common point between the P and N channel transistors each being connected to the output of the gate:

|  |  | P Channel | N Channel |
|---|---|---|---|
| Gate 1a | group 1 | CK serial D | A serial CK |
| (B) | group 2 | A | A serial D |
| Gate 1b | group 1 | B | B serial CK |
| (A) | group 2 | CK | — |
| Gate 2a | group 1 | CK serial Q | A serial CK |
| (NQ) | group 2 | A | A serial Q |
| Gate 2b | group 1 | NQ | NQ |
| (Q) |  |  |  |

Comparing this branch diagram with that of FIG. 1A, it will be observed that 1) one of the transistors of the N-channel branch of the first group in gate 1a is controled by the variable A, instead of by the variable C, 2) no inverter delivering the variable C is employed and 3) one of the transistors of the N-channel branch of the first group of gate 2a is controled by the variable A instead of by the variable C.

By drawing up the state table for this flip-flop, it is observed that it exhibits two critical races which can be eliminated by dimensioning the transistors of the flip-flop in such a way that these critical races are always won by the variable A rather than the variable B. Such dimensioning poses no problems insofar as the gate A (1b) is a straightforward NAND gate, A being moreover an internal variable of the flip-flop. On the other hand, this embodiment has the advantage of simplicity since only twenty transistors are required to construct it. It will be noted in particular that gate 2a of the slave 2 includes seven transistors only. In this case, the compromise is therefore biased in favor of the simplicity of the circuit, forethought having to be applied with regard to the dimensioning of the circuit during its design.

FIGS. 3A and 3B show a variant of the embodiment just described, this variant constituting a divider by 2. To obtain this function, the variable D controling the gate 1a is in fact the complement output variable, namely the variable NQ which is applied to one of the inputs of the AND elementary gate 1a-1 via a connection 3 (FIG. 3a). It can be seen from the branch diagram of FIG. 3B that the gate 1a then includes a first P-channel group with CK serial NQ transistors and a second N-channel group with A serial NQ transistors. This flip-flop also includes twenty transistors and should be dimensioned suitably so as to eliminate racing, as described above in conjunction with FIGS. 2A and 2B.

The branch diagram for this variant is as follows:

|         |         | P Channel    | N Channel    |
|---------|---------|--------------|--------------|
| Gate 1a | group 1 | CK serial NQ | A serial CK  |
| (B)     | group 2 | A            | A serial NQ  |
| Gate 1b | group 1 | B            | B serial CK  |
| (A)     | group 2 | CK           | —            |
| Gate 2a | group 1 | CK serial Q  | A serial CK  |
| (NQ)    | group 2 | A            | A serial Q   |
| Gate 2b | group 1 | NQ           | NQ           |
| (Q)     |         |              |              |

FIGS. 4A and 4B show another variant of the embodiment of FIGS. 2A and 2B, this circuit forming a flip-flop furnished with a command for setting the Q output to "1" via the variable S which is active in the "0" state. The functional diagram for this flip-flop (FIG. 4A) shows that, in order to take the variable S into account, the NAN D gate 1b-1 includes an additional input 4 controled by the variable S. Similarly, the inverter 2b-1 which constitutes the gate 2b in FIG. 2A is replaced with a NAND gate which includes an input 5 which is also controled by the variable S.

The branch diagram of FIG. 4B shows moreover the following design in respect of the topography of this flip-flop (gates 1a and 2a remaining unchanged):

|         |         | P Channel   | N Channel           |
|---------|---------|-------------|---------------------|
| Gate 1a | group 1 | CK serial D | A serial CK         |
| (B)     | group 2 | A           | A serial D          |
| Gate 1b | group 1 | B           | S serial B serial CK |
| (A)     | group 2 | CK          | —                   |
|         | group 3 | S           | —                   |
| Gate 2a | group 1 | CK serial Q | A serial CK         |
| (NQ)    | group 2 | A           | A serial Q          |
| Gate 2b | group 1 | NQ          | S serial NQ         |
| (Q)     | group 2 | S           | —                   |

It is observed that this flip-flop furnished with the function S (SET) includes twenty-four transistors only, however it also exhibits two critical races which can be avoided by dimensioning the transistors suitably.

A second embodiment of the invention will now be described whilst referring to FIGS. 5A and 5B. It differs from the embodiment of FIGS. 2A and 2B in that the gate 1b includes two elementary logic circuits as replacement for the single NAND gate 1b-1 represented in FIG. 2A. More precisely, an inverter 1b-2 which delivers the variable C is linked between the output of the gate 1a and one of the inputs of the AND elementary gate of gate 1a. This inverter delivers the variable C as transfer variable to the slave flip-flop 2 on one of the inputs of the AND elementary gate 2a-2.

Gate 1b also includes a NAND elementary gate 1b-3, one of the inputs of which receives the variable B from gate 1a and the other input of which is controled by the variable CK. The output of the NAND elementary gate 1b-3 delivers the variable A which is also a transfer variable in respect of the master 1 and the slave 2 and controls one of the inputs of the AND elementary gate 2a-1 of gate 2a. The variable A also controls one of the inputs of the elementary gate 1a-1 via a connection 6.

A priori, it could be said that this embodiment of the invention does not differ from the diagram of the known flip-flop represented in FIGS. 1A and 1B. This is true as regards the functional diagram of FIGS. 1A and 5A. However, on examining the branch diagrams of FIGS. 1B and 5B, it is appreciated that the construction of the gate 2a is different in that it is devoid of the P-channel branch of the first group of transistors C and Q which is found in the branch diagram of the prior art.

Consequently, according to the embodiment of the invention represented in FIG. 5B, the gate 2a of the slave can be constructed with seven transistors only instead of nine in the prior art. Indeed, it turns out that by disposing of the two transistors in question, all racing is eliminated during the operation of the master-slave flip-flop of FIGS. 5A and 5B. The designer therefore has greater flexibility with regard to the dimensioning of the transistors of this flip-flop since he need take no account of racing. The branch diagram therefore exhibits the following form:

|         |            | P Channel   | N channel   |
|---------|------------|-------------|-------------|
| Gate 1a | group 1    | CK serial D | C serial CK |
| (B)     | group 2    | A           | A serial D  |
| Gate 1b | group 1 (C)| B           | B           |
|         | group 2 (A)| B           | B serial CK |
|         | group 3 (A)| CK          | —           |
| Gate 2a | group 1    | CK serial Q | C serial CK |
| (NQ)    | group 2    | A           | A serial Q  |
| Gate 2b | group 1    | NQ          | NQ          |
| (Q)     |            |             |             |

FIGS. 6A and 6B show a first variant of the second embodiment of the invention, in which the flip-flop additionally includes a command for setting the output Q to zero through the variable R which is active at "0". For this purpose, the AND elementary gate 1a-1 includes a third input 7 controled by the variable R which is also applied to the slave 2, namely to a third input 8 of the AND elementary gate 2a-1.

The branch diagram of FIG. 6B shows a particular topography in respect of the gates 1a and 2a of this flip-flop as compared with the branch diagram of FIG. 5B, as follows:

|         |         | P Channel   | N channel            |
|---------|---------|-------------|----------------------|
| Gate 1a | group 1 | R           | —                    |
| (B)     | group 2 | CK serial D | R serial C serial CK |
|         | group 3 | A           | R serial A serial D  |

-continued

|  |  | P Channel | N channel |
|---|---|---|---|
| Gate 1b | group 1 (C) | B | B |
|  | group 2 (A) | B | B serial CK |
|  | group 3 (A) | CK | — |
| Gate 2a | group 1 | R | — |
| (NQ) | group 2 | CK serial Q | C serial CK |
|  | group 3 | A | R serial A serial Q |
| Gate 2b (Q) | group 1 | NQ | NQ |

This flip-flop is also devoid of racing and it is constructed using twenty-seven transistors while including command through the variable R which entails the use of five transistors. A sixth transistor R may be added if it is wished to avoid a transient state in which the NQ gate (2a) is short-circuited with CK=1. This transistor R should then be inserted into the N-channel branch of the second group of transistors of this gate.

FIGS. 7A and 7B show a second variant of the second embodiment of the invention which includes a command for setting the signal Q to "1" through the variable S which is active at "0". The latter controls a third input 9 of the NAND elementary gate 1b-3. Moreover, the gate 2b here includes an elementary gate 2b-1 of NAND type, one of the inputs 10 of which is also controled by the variable S.

The branch diagram of this flip-flop includes particular topographies as regards gates 1b and 2b as follows:

|  |  | P Channel | N channel |
|---|---|---|---|
| Gate 1a | group 1 | CK serial D | C serial CK |
| (B) | group 2 | A | A serial D |
| Gate 1b | group 1 (C) | B | B |
|  | group 2 (A) | B | S serial B serial CK |
|  | group 3 (A) | CK | — |
|  | group 4 (A) | S | — |
| Gate 2a | group 1 | CK serial Q | C serial CK |
| (NQ) | group 2 | A | A serial Q |
| Gate 2b | group 1 | NQ | S serial NQ |
| (Q) | group 2 | S | — |

Consequently, this master-slave flip-flop includes 26 transistors and is also devoid of racing, while enjoying control through the variable S.

The flip-flops according to the variants of FIGS. 6A, 6B, 7A and 7B have the feature that the transistors controled respectively by the variables S and R are connected in parallel in the P-channel branches and in series in the N-channel branches. Thus, the operating speed of these flip-flops does not suffer from the presence of these transistors, since three transistors in an N-channel branch have the same performance in this respect as two transistors in a P-channel branch.

Another variant of the second embodiment of the invention (which is not represented in the drawings) consists in combining the two commands S and R within one master-slave flip-flop by as it were superimposing the diagrams of FIGS. 6A and 7A, on the one hand, and 6B and 7B on the other.

Reference will now be made to FIGS. 8A and 8B in order to describe another variant of the first embodiment of the invention, derived from the diagram of FIGS. 2A and 2B. This variant includes a command for setting the output Q to zero through the variable R which is active at "1". This flip-flop differs from the previous variants of the first embodiment in that the gate 1b includes an AND elementary gate 1b-4, a first input of which is controled by the variable CK and the other input of which receives the variable B. The output of this AND gate 1b-4 is linked to one of the inputs of an NOR elementary gate 1b-5, the other input of which is controled by the variable R. The output of this gate 1b-5 yields the transfer variable A and is linked to one of the respective inputs of the AND elementary gates 1a-1 and 1a-2.

The branch diagram of this memory element is as follows:

|  |  | P Channel | N Channel |
|---|---|---|---|
| Gate 1a | group 1 | CK serial D | A serial CK |
| (B) | group 2 | A | A serial D |
| Gate 1b | group 1 | B serial R | B serial CK |
| (A) | group 2 | CK serial R | R |
| Gate 2a | group 1 | CK serial Q | A serial CK |
| (NQ) | group 2 | A | A serial Q |
| Gate 2b (Q) | group 1 | NQ | NQ |

This variant includes twenty-three transistors only, but it exhibits a critical race which must be eliminated by dimensioning the transistors appropriately. Of course, to obtain a command R which is active at zero, an inverter must be provided as regards the variable R, this bringing the number of transistors to twenty-five.

FIGS. 9A and 9B represent a variant also derived from the first embodiment of the invention. This variant includes commands R and S which are active at "0" (in the absence of the inverter 11 represented dotted). The functional diagram of this variant is identical to that of FIG. 8A as regards the command through the variable R, except that the NAND elementary gate 1b-4 includes a third input 12 which is controled by the variable S. Moreover, in the slave 2 the gate 2b includes a NAND elementary gate 2b-1 with two inputs, one of which is also controled by the variable S.

This variant includes twenty-seven transistors and if it is desired to work with a variable R which is active at "1", the inverter 11 should be provided, thus increasing the number of transistors to twenty-nine. The branch diagram of FIG. 9B shows the topography of this variant which is designed as follows:

|  |  | P Channel | N Channel |
|---|---|---|---|
| Gate 1a | group 1 | CK serial D | A serial CK |
| (B) | group 2 | A | A serial D |
| Gate 1b | group 1 | B serial R | S serial B serial CK |
| (A) | group 2 | CK serial R | R |
|  | group 3 | S | — |
| Gate 2a | group 1 | CK serial Q | A serial CK |
| (NQ) | group 2 | A | A serial Q |
| Gate 2b | group 1 | NQ | S serial NQ |
| (Q) | group 2 | S | — |

In the variants of FIGS. 3A–3B, 4A–4B, 8A–8B and 9A–9B, the N-channel branches of the gates 1a and 2a include two transistors A in parallel. According to another variant derived from the flip-flop of FIGS. 3A and 3B and represented in FIGS. 10A and 10B, it is shown that these transistors can be replaced by a single transistor A thereby allowing a saving of transistors, whilst the diagram no longer consists entirely of branches. The functional diagram of the flip-flop then takes a somewhat different appearance although the functionalities remain the same.

FIGS. 11A and 11B show a variant of the divider by 2 of FIGS. 3A and 3B in which, as in these figures, the output variable NQ is taken back to the input D of the master flip-flop 1. However, as compared with FIGS. 3A and 3B, the gate 2b can be omitted since the variable NQ can be used directly as variable of half the frequency of that of the variable CK unlike a D flip-flop in which in general the variable Q must be employed.

FIG. 11A therefore shows this diagram in which the slave flip-flop includes the gate 2a only, the latter receiving as input variable the transfer variable B coming from the gate 1a.

This element includes critical races which can be avoided if the variable A is faster than the variable B, which in turn should be faster than the variable NQ. However, this element has only 18 transistors, this number being reducible to 16 if the two transistors A in gate 2a are replaced with a single transistor.

It is therefore seen that the invention proposes a number of configurations of a master-slave D flip-flop making it possible to obtain either complete absence of racing or racing which may be remedied by dimensioning the transistors appropriately, this being easily achieved. By biasing the compromise stated above in favor of the absence of racing, some slight sacrifice is conceded in respect of operating speed, small size and/or low consumption. On the other hand, by accepting some critical racing, it is possible to achieve a reduction in area (size) of up to 20%, low consumption and an increase in the speed of operation. The designer will prefer one or the other compromise when designing integrated circuits which are required to include D-type flip-flops as described above.

We claim:

1. A master-slave flip-flop CMOS memory element able to transfer an input logic variable (D) to a true output variable (Q) and a complementary output variable (NQ) of the memory element under the control of a clock signal (CK), said memory element including a master flip-flop (1), a slave flip-flop (2) controlled by said master flip-flop by means of at least one transfer variable (A,C) generated by said master flip-flop, said slave flip-flop (2) including a first gate (2a) controlled by said at least one transfer variable (A,C), said clock signal (CK) and said true output variable (Q), so as to deliver said complementary output variable (NQ) at its output, and a second gate (2b) controlled by said complementary output variable (NQ) and delivering said true output variable (Q) at its output, said master flip-flop (1) including a first gate (1a) having inputs receiving said input logic variable (D), said clock signal (CK) and at least one third variable constituted by said at least one transfer variable (A,C) and having an output (B), said master flip-flop (1) also including a second gate (1b) of inverting type controlled by the output (B) from said first gate (1a) of the master flip-flop (1) and delivering at its output at least one of said transfer variables (A,C), wherein said first gate (2a) of said slave flip-flop (2) includes, in order to accomplish the transfer of said input signal, not more than seven transistors.

2. The memory element (FIGS. 2A, 3A, 4A, 11A) as claimed in claim 1, wherein said second gate of inverting type (1b) of the master flip-flop (1) includes a NAND type gate (1b-1) having a output, a first input of which is controlled by the output (B) from said first gate (1a) of the master flip-flop (1), a second input of which is controlled by said clock signal (CK), the output of said NAND gate being fed back to said first gate (1a) of the master flip-flop (1), and constituting the output of said second gate of inverting type delivering a transfer variable (A).

3. The memory element as claimed in claim 2, wherein such memory element is constructed in accordance with a branch diagram which exhibits the following form:

| | | P Channel | N Channel |
|---|---|---|---|
| Gate 1a (B) | group 1 | CK serial D | A serial CK |
| | group 2 | A | A serial D |
| Gate 1b (A) | group 1 | B | B serial CK |
| | group 2 | CK | — |
| Gate 2a (NQ) | group 1 | CK serial Q | A serial CK |
| | group 2 | A | A serial Q |
| Gate 2b (Q) | group 1 | NQ | NQ |

4. The memory element (FIG. 11A) as claimed in claim 1, wherein such memory element constitutes a divider by 2 and wherein, and complementary output (NQ) is fed back (connection 3) to the input of said first gate (1a) of the master flip-flop (1) receiving said input variable (D=NQ).

5. The memory element as claimed in claim 4, wherein such memory element is constructed in accordance with a branch diagram which exhibits the following form:

| | | P Channel | N Channel |
|---|---|---|---|
| Gate 1a (B) | group 1 | CK serial NQ | A serial CK |
| | group 2 | A | A serial NQ |
| Gate 1b (A) | group 1 | B | B serial CK |
| | group 2 | CK | — |
| Gate 2a (NQ) | group 1 | CK serial Q | A serial CK |
| | group 2 | A | A serial Q |
| Gate 2b (Q) | group 1 | NQ | NQ |

6. The memory element as claimed in claim 2, wherein such memory element also comprises a set to "1" command (S) for said true output (Q) and wherein said second gate (1b) of the master flip-flop (1) and said second gate (2b) of said slave flip-flop (2) each include an additional input (4, 5) which receives said set to "1" command (S).

7. The memory element as claimed in claim 6, wherein such memory element is constructed in accordance with a branch diagram which exhibits the following form:

| | | P Channel | N Channel |
|---|---|---|---|
| Gate 1a (B) | group 1 | CK serial D | A serial CK |
| | group 2 | A | A serial D |
| Gate 1b (A) | group 1 | B | S serial B serial CK |
| | group 2 | CK | — |
| | group 3 | S | — |
| Gate 2a (NQ) | group 1 | CK serial Q | A serial CK |
| | group 2 | A | A serial Q |
| Gate 2b (Q) | group 1 | NQ | NQ serial S |
| | group 2 | S | — |

8. The memory element (FIGS. 5A, 6A) as claimed in claim 1, wherein said second gate of the inverting type (1b) of said master flip-flop (1) includes an elementary inverter (1b-2) having an input and an output, the input of which is connected to the output (B) of said first gate (1a) of this flip-flop (1) and the output of which being fed back in order to control said first gate (1a) of the master flip-flop (1) and constituting one of said transfer variables (C), said second gate of the inverting type (1b) also comprising a NAND type elementary gate (1b-3), a first input of which is connected to the output (B) of said first gate (1a) of the master flip-flop (1), a second input of which is controlled by said clock signal (CK) and the output from which constituteing a second transfer variable (A) for said slave flip-flop (2), and being fed back in order to control said first gate (1a) of said master flip-flop (1).

9. The memory element as claimed in claim 8, wherein such memory element is constructed in accordance with a branch diagram which exhibits the following form:

|  |  | P Channel | N channel |
|---|---|---|---|
| Gate 1a | group 1 | CK serial D | C serial CK |
| (B) | group 2 | A | A serial D |
| Gate 1b | group 1 (C) | B | B |
|  | group 2 (A) | B | B serial CK |
|  | group 3 (A) | CK | — |
| Gate 2a | group 1 | CK serial Q | C serial CK |
| (NQ) | group 2 | A | A serial Q |
| Gate 2b (Q) | group 1 | NQ | NQ |

10. The memory element as claimed in claim 8, wherein such memory element also comprises a set to "0" command (R) for said true output (Q) and wherein said first gate (1a) of the master flip-flop (1) and said first gate (2a) of said slave flip-flop (2) each include an additional input (7, 8) which receives said set to "0" command (R).

11. The memory element as claimed in claim 10, wherein such memory element is constructed in accordance with a branch diagram which exhibits the following form:

|  |  | P Channel | N channel |
|---|---|---|---|
| Gate 1a | group 1 | R | — |
| (B) | group 2 | CK serial D | R serial C serial CK |
|  | group 3 | A | R serial A serial D |
| Gate 1b | group 1 (C) | B | B |
|  | group 2 (A) | B | B serial CK |
|  | group 3 (A) | CK | — |
| Gate 2a | group 1 | R | — |
| (NQ) | group 2 | CK serial Q | C serial CK |
|  | group 3 | A | R serial A serial Q |
| Gate 2b (Q) | group 1 | NQ | NQ |

12. The memory element according to claim 8, wherein such memory element also comprises a set to "1" command (S) for said true output (Q) and wherein said second gate (1b) of the master flip-flop (1) and said second gate (2b) of said slave flip-flop (2) each include an additional input (9, 10) which receives said set to "1" command (S).

13. The memory element as claimed in claim 12, wherein such memory element is constructed in accordance with a branch diagram which exhibits the following form:

|  |  | P Channel | N channel |
|---|---|---|---|
| Gate 1a | group 1 | CK serial D | C serial CK |
| (B) | group 2 | A | A serial D |
| Gate 1b | group 1 (C) | B | B |
|  | group 2 (A) | B | S serial B serial CK |
|  | group 3 (A) | CK | — |
|  | group 4 (A) | S | — |
| Gate 2a | group 1 | CK serial Q | C serial CK |
| (NQ) | group 2 | A | A serial Q |
| Gate 2b | group 1 | NQ | S serial NQ |
| (Q) | group 2 | S | — |

14. The memory element as claimed in claim 1, wherein said second inverting-type gate (1b) of the master flip-flop (1) includes an AND-type gate (1b-4) and a NOR-type sate (1b-5), said AND-type sate having a first input controlled by the output (B) from said first gate (1a) of the master flip-flop (1), a second input controlled by said clock signal (CK) and an output, said NOR-type gate having a first input controlled by the output of said AND-type gate, a second input controlled by a set to "0" signal (R) for said true output (Q), and an output that is fed back to said first gate (1a) of the master flip-flop (1) and that yields said transfer variable (A).

15. The memory element as claimed in claim 14, wherein such memory element is constructed in accordance with a branch diagram which exhibits the following form:

|  |  | P Channel | N Channel |
|---|---|---|---|
| Gate 1a | group 1 | CK serial D | A serial CK |
| (B) | group 2 | A | A serial D |
| Gate 1b | group 1 | B serial R | B serial CK |
| (A) | group 2 | CK serial R | R |
| Gate 2a | group 1 | CK serial Q | A serial CK |
| (NQ) | group 2 | A | A serial Q |
| Gate 2b (Q) | group 1 | NQ | NQ |

16. The memory element as claimed in claim 14, wherein such memory element also comprises a set to "1" command (S) for said true output (Q) and wherein said second gate (1b) of the master flip-flop (1) and said second gate (2b) of said slave flip-flop (2) each include an additional input (4, 5) which receives said set to "1" command (S).

17. The memory element as claimed in claim 16, wherein such memory element is constructed in accordance with a branch diagram which exhibits the following form:

|  |  | P Channel | N Channel |
|---|---|---|---|
| Gate 1a | group 1 | CK serial D | A serial CK |
| (B) | group 2 | A | A serial D |
| Gate 1b | group 1 | B serial R | S serial B serial CK |
| (A) | group 2 | CK serial R | R |
|  | group 3 | S | — |
| Gate 2a | group 1 | CK serial Q | A serial CK |
| (NQ) | group 2 | A | A serial Q |
| Gate 2b | group 1 | NQ | S serial NQ |
| (Q) | group 2 | S | — |

18. The memory element as claimed in claim 3, wherein the transistors controlled by the variable A in the N-Channel portions of the two groups of transistors of gates 1a and 2a are are constituted in each of said gates by a single transistor (A) forming a common series path on such N-Channel transistors.

19. The memory element as claimed in claim 5, wherein the transistors controlled by the variable A in the N-Channel portions of the two groups of transistors of gates 1a and 2a are are constituted in each of said gates by a single transistor (A) forming a common series path on such N-Channel transistors.

20. The memory element as claimed in claim 7, wherein the transistors controlled by the variable A in the N-Channel portions of the two groups of transistors of gates 1a and 2a are are constituted in each of said gates by a single transistor (A) forming a common series path on such N-Channel transistors.

21. The memory element as claimed in claim 15, wherein the transistors controlled by the variable A in the N-Channel portions of the two groups of transistors of gates 1a and 2a are are constituted in each of said gates by a single transistor (A) forming a common series path on such N-Channel transistors.

22. The memory element as claimed in claim 16, wherein the transistors controlled by the variable A in the N-Channel portions of the two groups of transistors of gates 1a and 2a are are constituted in each of said gates by a single transistor (A) forming a common series path on such N-Channel transistors.

23. A CMOS master-slave flip-flop memory element able to deliver an output logic variable (NQ) which is a division by two of an input logic variable (CK), said memory element including a master flip-flop (1), a slave flip-flop (2) controlled by said master flip-flop (1) by means of transfer variables (A,B) generated by said master flip-flop, said slave flip-flop (2) including a gate (2a) controlled by said transfer variables (A,B) and said input logic variable (CK), for delivering said output logic variable (NQ), said master flip-flop (1) including a first gate (1a) having an output (B), and being controlled by said input logic variable (CK) and another variable (D) constituted by said output logic variable (NQ), said master flip-flop (1) also including a second gate (1b) of inverting type controlled by the output (B) from said first gate (1a) of the master flip-flop (1) and said input variable (CK) so as to deliver one of said transfer variables (A,B), wherein said gate (2a) of said slave flip-flop (2) includes at most seven transistors, in order to accomplish the transfer of said input variable (CK).

24. The memory element as claimed in claim 23, wherein such memory element is constructed in accordance with a branch diagram which exhibits the following form:

|  |  | P Channel | N Channel |
|---|---|---|---|
| Gate 1a | group 1 | CK serial NQ | A serial CK |
| (B) | group 2 | A | A serial NQ |
| Gate 1b | group 1 | B | B serial CK |
| (A) | group 2 | CK | — |
| Gate 2a | group 1 | CK serial Q | A serial CK |
| (NQ) | group 2 | A | A serial Q |

25. The memory element as claimed in claim 24, wherein the transistors controlled by the variable A in the N-Channel portions of the two groups of transistors of said gate (2a) of said slave flip-flop (2) include a single transistor controlled by one of said transfer variables (A) and forming a common series path on these N-Channel transistors.

* * * * *